United States Patent
Kobayashi et al.

(10) Patent No.: US 9,022,804 B2
(45) Date of Patent: May 5, 2015

(54) WATERPROOF PLUG

(75) Inventors: Masaki Kobayashi, Makinohara (JP); Kenichi Okamoto, Makinohara (JP)

(73) Assignee: Yazaki Corporation, Tokyo (JP)

( * ) Notice: Subject to any disclaimer, the term of this patent is extended or adjusted under 35 U.S.C. 154(b) by 47 days.

(21) Appl. No.: 13/816,761

(22) PCT Filed: Aug. 3, 2011

(86) PCT No.: PCT/JP2011/067790
§ 371 (c)(1),
(2), (4) Date: Apr. 19, 2013

(87) PCT Pub. No.: WO2012/023438
PCT Pub. Date: Feb. 23, 2012

(65) Prior Publication Data
US 2013/0277920 A1    Oct. 24, 2013

(30) Foreign Application Priority Data

Aug. 18, 2010  (JP) ................................. 2010-183132

(51) Int. Cl.
*H01R 13/40* (2006.01)
*H05K 5/06* (2006.01)
(Continued)

(52) U.S. Cl.
CPC ............ *H05K 5/069* (2013.01); *H01R 13/5205* (2013.01); *H01R 13/56* (2013.01)

(58) Field of Classification Search
USPC ......... 439/274, 279, 587, 275, 588–589, 523, 439/730, 867, 271, 273, 272, 278, 282, 586
See application file for complete search history.

(56) References Cited

U.S. PATENT DOCUMENTS

| 4,735,581 A | 4/1988 | Endo et al. |
| 4,895,533 A | 1/1990 | Yagi et al. |
| 5,395,266 A | 3/1995 | Abe et al. |

(Continued)

FOREIGN PATENT DOCUMENTS

| CN | 101123334 A | 2/2008 |
| CN | 101436736 A | 5/2009 |

(Continued)

OTHER PUBLICATIONS

European Search Report issued in European Patent Application No. 11818080.1-1801 / 2608324 PCT/JP2011067790 on Jul. 24, 2014.
Chinese Office Action issued in Chinese Patent Application No. 201180017604.1 on Jun. 17, 2014.

*Primary Examiner* — Edwin A. Leon
(74) *Attorney, Agent, or Firm* — Morgan, Lewis & Bockius LLP

(57) ABSTRACT

A waterproof plug includes a cylindrical resin member and a sealing section configured to include an outer circumference section which is provided on an outer face of the resin member and an inner circumference section which is provided on an inner face of the resin member. The outer circumference section intimately contacts to an inner wall face of a cavity of a connector housing, and the inner circumference section intimately contacts to an outer circumference face of an electric wire. An outer circumference face of the resin member is brought into contact with an inner wall face of an electric wire through hole of the connector housing. The resin member has a plurality of protruded claw sections protruding toward the inner circumference section side along a circumference direction of the resin member.

2 Claims, 4 Drawing Sheets

(51) Int. Cl.
*H01R 13/52* (2006.01)
*H01R 13/56* (2006.01)

(56) References Cited

U.S. PATENT DOCUMENTS

| | | | |
|---|---|---|---|
| 5,660,566 A * | 8/1997 | Ohsumi | 439/587 |
| 7,147,500 B2 * | 12/2006 | Tabata et al. | 439/274 |
| 7,997,916 B2 * | 8/2011 | Yoshioka et al. | 439/273 |
| 2006/0019535 A1 | 1/2006 | Fukushima et al. | |
| 2008/0003876 A1 | 1/2008 | Fukaya et al. | |
| 2009/0130901 A1 | 5/2009 | Aoki et al. | |

FOREIGN PATENT DOCUMENTS

| | | |
|---|---|---|
| GB | 2 187 896 A | 9/1987 |
| JP | 60-133587 | 9/1985 |
| JP | 60-127683 | 8/1987 |
| JP | 62-127683 U | 8/1987 |
| JP | 5-166564 | 7/1993 |
| JP | 07-201404 | 8/1995 |
| JP | 10-321288 | 12/1998 |
| JP | 2006-032199 | 2/2006 |
| JP | 2009-123584 | 6/2009 |

* cited by examiner

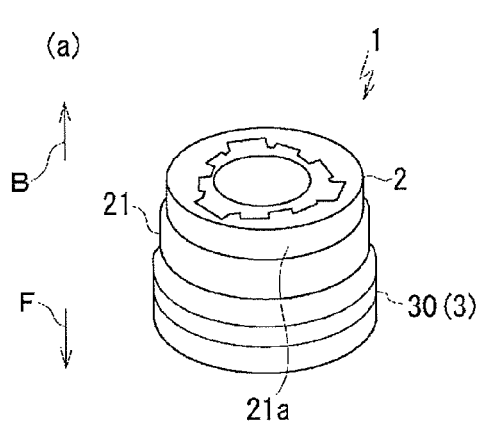
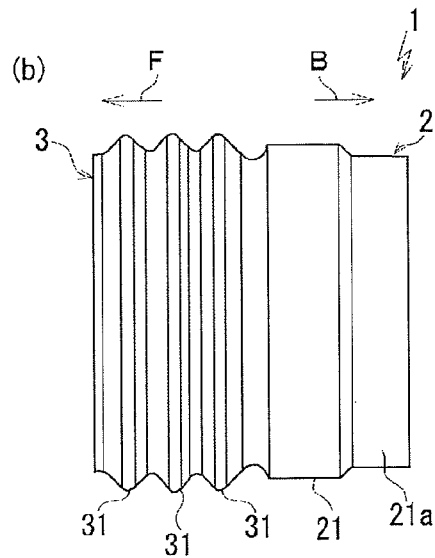
Fig. 1(a)
Fig. 1(b)
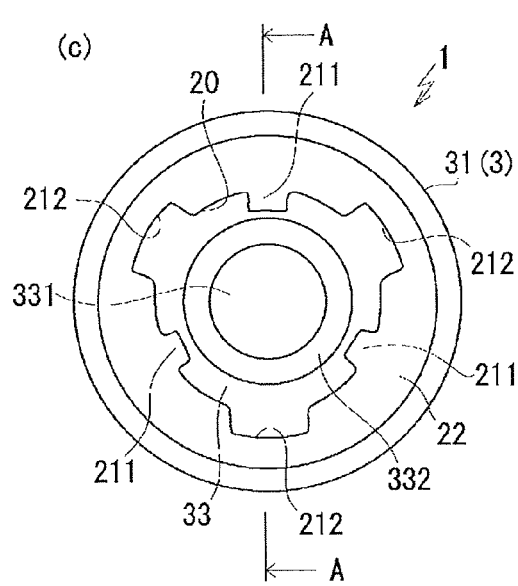
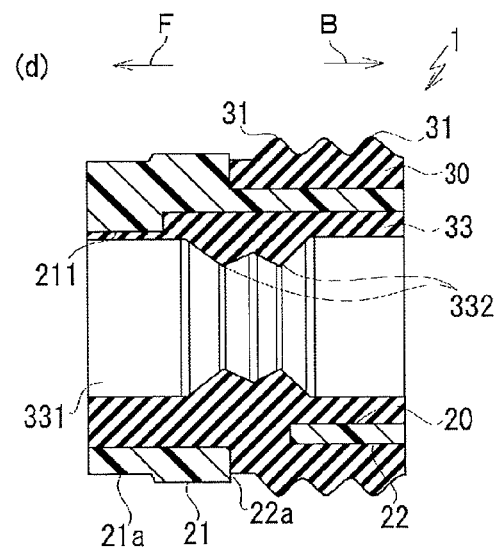
Fig. 1(c)
Fig. 1(d)

PRIOR ART

WATERPROOF PLUG

TECHNICAL FIELD

The present invention relates to a waterproof plug.

BACKGROUND ART

In a waterproof plug disclosed in the following Patent Reference 1, a cylindrical resin member is buried so as to surround a coated electric wire and at the time of bending the electric wire, direct contact between the electric wire and an electric wire insertion hole of a shield shell is avoided by bringing the electric wire into contact with the resin member and the electric wire is prevented from being damaged by making sliding contact with the electric wire insertion hole.

PRIOR ART REFERENCE

Patent Reference

Patent Reference 1: JP-A-2009-123584

DISCLOSURE OF THE INVENTION

Problems that the Invention is to Solve

The conventional waterproof plug described above has a fear of causing a gap between the bent electric wire and the resin member. Also, when the resin member is thickened in the whole circumference and the bending range of the electric wire is decreased in order to avoid this fear, there is a fear of decreasing waterproofness by decreasing a rubber filling factor which is a ratio of rubber to the electric wire insertion hole.

The invention has been implemented in view of such a problem, and an object of the invention is to provide a waterproof plug capable of improving waterproofness.

Means for Solving the Problems

The object of the invention is achieved by the following configuration.

(1) A waterproof plug in which the outside and the inside of a cylindrical resin member are provided with a sealing section including an outer circumference section which intimately contacts to an inner wall face of a cavity of a connector housing, and an inner circumference section which intimately contacts to an outer circumference face of an electric wire, the electric wire pulled out of the cavity being inserted into the inner circumference section, and an outer circumference face of the resin member is brought into contact with an inner wall face of an electric wire through hole of the connector housing in which the electric wire is pulled out of the cavity, wherein the resin member is provided with a plurality of protruded claw sections protruding toward the inner circumference section side along a circumference direction thereof.

(2) The waterproof plug according to the configuration of the above (1), wherein at least the three protruded claw sections are formed at a predetermined spacing.

According to the waterproof plug with the configuration of the above (1), the amount of movement of the electric wire inside the electric wire through hole of the connector housing is reduced and a reduction in seal pressure due to occurrence of a gap between the bent electric wire and the inner circumference section of the sealing section is prevented and waterproofness can be improved.

BRIEF DESCRIPTION OF THE DRAWINGS

FIGS. 1(a) to 1(d) are views showing a waterproof plug of one embodiment of the invention, and FIG. 1(a) is a perspective view seen from the back, and FIG. 1(b) is a side view, and FIG. 1(c) is a rear view, and FIG. 1(d) is a sectional view taken on arrow A-A of FIG. 1(c).

FIG. 2(a) is a perspective view seen from the back, and FIG. 2(b) is a perspective view seen from the front.

FIG. 3(a) is a sectional view along the front-back direction, and FIG. 3(b) is a partially enlarged view of FIG. 3(a).

MODE FOR CARRYING OUT THE INVENTION

One embodiment of the invention will hereinafter be described with reference to the drawings.

Figure 2A:
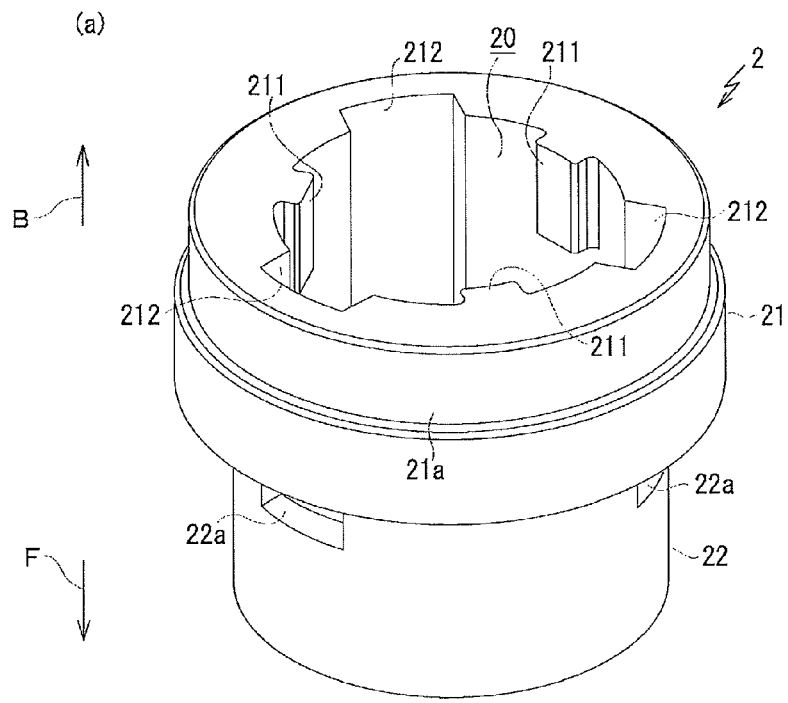
FIGS. 2(a) and 2(b) are views showing a resin member included in the waterproof plug of FIG. 1.
Figure 2B:
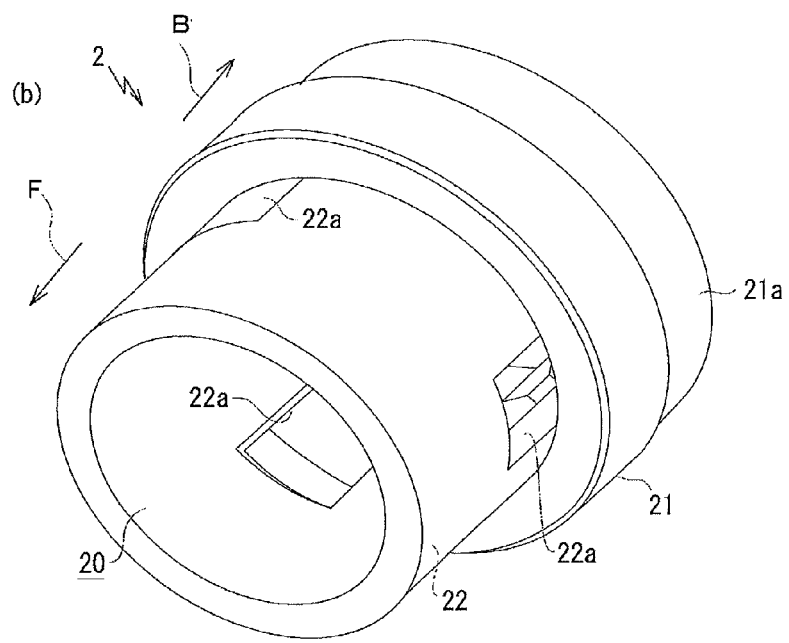
Figure 3A:
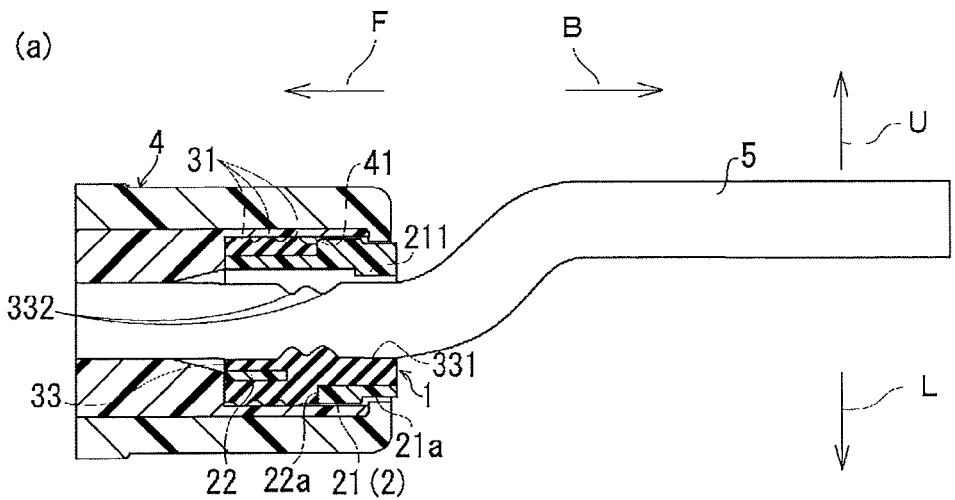
FIGS. 3(a) and 3(b) are views showing a sealing structure of a cavity using the waterproof plug of FIG. 1.
Figure 3B:
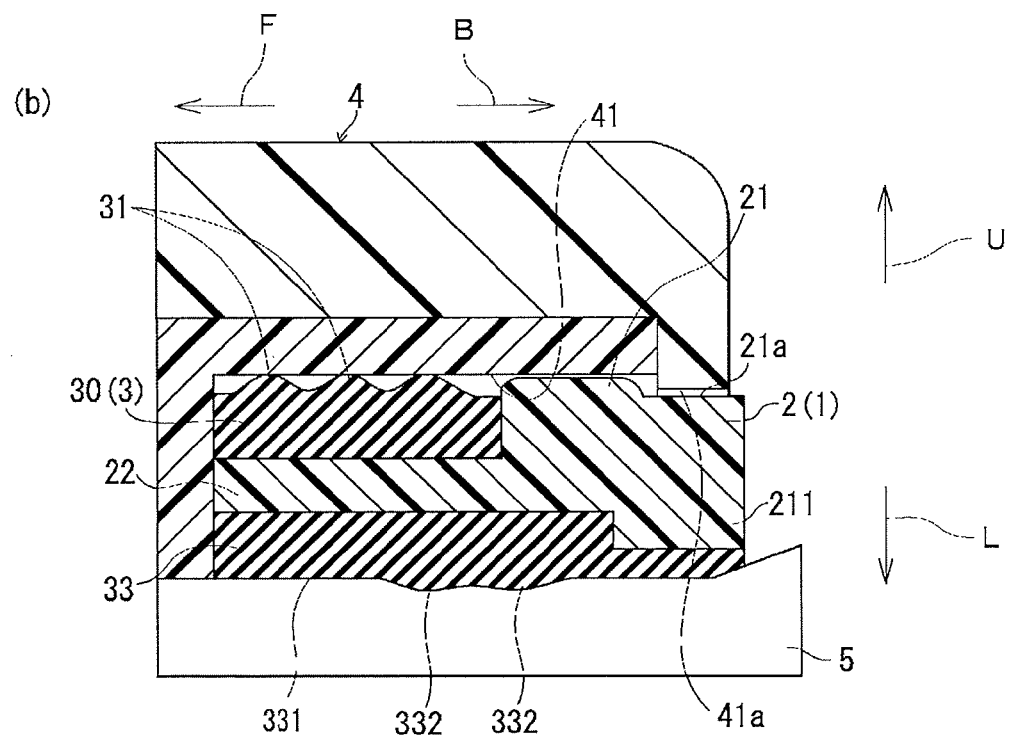

FIGS. 1(a) to 1(d) are views showing a waterproof plug 1 of the present embodiment. FIGS. 2(a) and 2(b) are perspective views showing a resin member 2 of the waterproof plug 1. FIGS. 3(a) and 3(b) are views showing a sealing structure of a cavity 41 using the waterproof plug 1. In addition, arrows F and B in the drawings show the front and back directions of the waterproof plug 1. Also, arrows U and L in the drawings show the upper and lower directions of the waterproof plug 1.

The waterproof plug 1 shown in FIGS. 1(a) to 1(d) is a plug which is attached to the inside of the cavity 41 (see FIGS. 3(a) and 3(b)) of a connector housing etc. and seals a gap between the cavity 41 and an electric wire 5 pulled out of the cavity 41. The waterproof plug 1 includes the cylindrical resin member 2 and a sealing section 3 provided on the resin member 2.

As shown in FIGS. 2(a) and 2(b), the resin member 2 includes a fitting section 21 and a cylindrical fixing section 22 with an outside diameter smaller than that of the fitting section 21, and a through hole 20 extends from the back end to the front end.

The back end of the fitting section 21 forms a contacting section (an outer circumference face of the resin member) 21a configured to decrease an outside diameter. The fitting section 21 is provided with three protruded claw sections 211 having a quadrilateral block shape, and three longitudinal grooves 212 having a rectangular cross-sectional shape.

The protruded claw sections 211 are equally spaced on an inner circumference face of the through hole 20 along the circumference direction of the through hole 20. In the present embodiment, the protruded claw sections 211 are arranged so as to equally divide the inner circumference face of the through hole 20 along the circumference direction. The longitudinal grooves 212 are arranged in positions opposite to the protruded claw sections 211 of the inner circumference face of the through hole 20, and are equally spaced along the circumference direction of the through hole 20. A communication hole 22a extends from the back end of each of the longitudinal grooves 212 to the front end of the fixing section 22. The communication hole 22a is pierced from an inner face to an outer face of the fixing section 22, and is communicated from the inside of the longitudinal groove 212 to the outside of the fixing section 22, and has a rectangular open shape.

The sealing section 3 is molded integrally to the resin member 2, and includes an outer circumference section 30 anchoring to the outer circumference of the fixing section 22 and an inner circumference section 33 anchoring to the inside of the through hole 20 as shown in FIG. 1(d). An outer circumference face of the outer circumference section 30 is provided with a plurality of outer circumference lip sections 31 from the front end side to the back end side. The outer circumference lip section 31 extends along the circumference direction of the outer circumference section 30 and has an annular shape.

In the inner circumference section 33, a cylindrical electric wire insertion hole 331 extends from a front end face to a back end face. Two inner circumference lip sections 332 are arranged at backward part and at forward part on an inner circumference face of the center in the front-back direction of the electric wire insertion hole 331. The inner circumference lip section 332 extends along the circumference direction of the electric wire insertion hole 331 and has an annular shape. The outer circumference section 30 is connected with the inner circumference section 33 in a state that both sections 30, 33 are mutually joined through the communication holes 22a of the fixing section 22.

As shown in FIGS. 3(a) and 3(b), the waterproof plug 1 having such a configuration is inserted into the cavity 41 of a connector housing 4, and the electric wire 5 pulled out of the cavity 41 is inserted into the electric wire insertion hole 331. In the waterproof plug 1 attached to the inside of the cavity 41, a gap between the cavity 41 and the waterproof plug 1 is sealed by bringing the outer circumference face of the outer circumference section 30 into pressure contact with an inner wall face of the cavity 41. Also, a gap between the electric wire 5 and the waterproof plug 1 is sealed by bringing the inner circumference face of the inner circumference section 33 into pressure contact with an outer circumference face of the electric wire 5 inserted into the electric wire insertion hole 331. The waterproof plug 1 produces a high seal pressure by crushing the outer circumference lip sections 31 and the inner circumference lip sections 332 against the cavity 41 and the electric wire 5 in formation places of the outer circumference lip sections 31 and the inner circumference lip sections 332.

When the electric wire 5 is bent upwardly as shown by arrow U in FIGS. 3(a) and 3(b) in a state that the gap between the cavity 41 and the electric wire 5 is sealed with the waterproof plug 1 in this manner, the inner circumference face of the upper side of the back end of the inner circumference section 33 is pressed upwardly by the electric wire 5. Accordingly, a place pressed by the electric wire 5 in the inner circumference section 33 is pinched between the electric wire 5 and the inner circumference face of the through hole 20 and is compressed, and the contacting section 21a is pressed against an inner circumference face of an edge section 41a which is an electric wire through hole of the connector housing 4 in which the electric wire 5 is pulled out of the cavity 41.

At this time, the wall thickness of the inner circumference section 33 pinched between the protruded claw sections 211 and the electric wire 5 becomes thin in formation places of the protruded claw sections 211, so that the amount of deformation of the inner circumference section 33 of the sealing section 3 is reduced and the amount of upward movement of the electric wire 5 inside the edge section 41a of the connector housing 4 is also reduced. As a result, a reduction in seal pressure between the upwardly bent electric wire 5 and the inner circumference face of the lower side of the back end of the inner circumference section 33 can be prevented.

Figure 4:
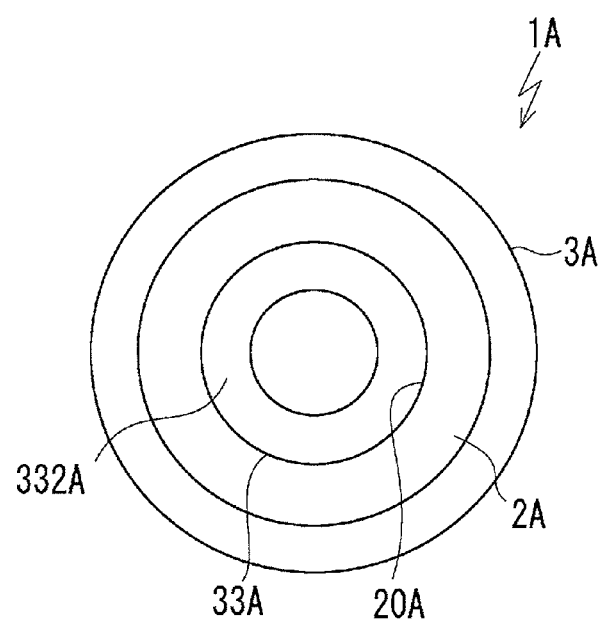
FIG. 4 is a rear view showing one example of a related waterproof plug without a protruded claw section.

Also, the bent electric wire 5 is pressed against the inner circumference section 33 of the sealing section 3 and is not pressed directly against the edge section 41a of the connector housing 4, so that the electric wire 5 can be prevented from being damaged. Also, the protruded claw sections 211 spaced on the inner circumference face of the through hole 20 receive the electric wire 5 through the inner circumference section 33, so that a factor of filling the inside of the cavity 41 with an elastic material constructing the sealing section 3 can be increased to improve waterproof performance by the waterproof plug 1 as compared with the case of decreasing an inside diameter of a through hole 20A in a resin member 2A and causing an inner circumference lip section 332A of an inner circumference section 33A in a sealing section 3A to follow displacement of the electric wire 5 as described in, for example, a related waterproof plug 1A shown in FIG. 4.

According to the embodiment, the amount of deformation of the inner circumference section 33 in the places pinched between the protruded claw sections 211 and the electric wire 5 is reduced and the amount of movement of the electric wire 5 inside the electric wire insertion hole 331 is reduced and thereby, a reduction in seal pressure due to occurrence of a gap between the bent electric wire 5 and the inner circumference lip sections 332 is prevented and also a reduction in a factor of filling the inside of the cavity 41 with an elastic material constructing the waterproof plug 1 is prevented and waterproofness can be improved.

Also, according to the embodiment, at least three protruded claw sections 211 are equally spaced on the inner circumference face of the through hole 20, so that a reduction in seal pressure between the electric wire 5 and the inner circumference face of the back end of the inner circumference section 33 can be prevented even when the electric wire 5 is bent in any direction.

Also, according to the embodiment, the inner circumference face of the through hole 20 is provided with the longitudinal grooves 212 and thereby, the factor of filling the inside of the cavity 41 with the elastic material constructing the waterproof plug 1 can be increased to improve waterproofness. Moreover, each of the longitudinal grooves 212 is equally spaced along the circumference direction of the through hole 20 and is arranged in the position opposite to the protruded claw section 211, so that the factor of filling the inside of the cavity 41 with the elastic material in the radial direction reduced by forming the protruded claw sections 211 can be compensated.

In addition, in each embodiment described above, the case of providing the inner circumference face of the through hole 20 with the three protruded claw sections 211 is described, but the number of protruded claw sections 211 is not limited to three and, for example, four or more protruded claw sections 211 may be arranged. Also, the shape of the protruded claw section 211 is not limited to the quadrilateral block shape. Also, in the embodiment described above, the case of providing the positions opposite to the protruded claw sections 211 with the longitudinal grooves 212 is described, but a configuration without the longitudinal groove 212 may be used. Also, a configuration without the communication hole 22a may be used.

Also, in the embodiment described above, the case of exposing the front end face of the fixing section 22 is described, but it may be configured to bury the whole fixing section 22 in the sealing section 3. Also, in the embodiment described above, the case of constructing the resin member 2 of the fitting section 21 and the fixing section 22 is described, but the resin member 2 may be constructed of only the fitting section 21. Also, in the embodiment described above, the case of providing the fitting section 21 with the contacting section 21a configured to decrease the outside diameter since the connector housing 4 includes the edge section 41a which is the electric wire through hole in a back end opening of the cavity 41 is described, but a configuration without the contacting section 21a may be used.

Also, the embodiment described above only shows a typical mode of the invention, and the invention is not limited to the embodiment. That is, various changes can be made without departing from the gist of the invention.

In addition, the present application is based on Japanese patent application (patent application No. 2010-183132) filed on Aug. 18, 2010, and the contents of the patent application are hereby incorporated by reference.

Industrial Applicability

According to a waterproof plug according to the invention, the amount of movement of an electric wire inside an electric wire insertion hole of an inner circumference section in a sealing section is reduced and a reduction in seal pressure due to occurrence of a gap between the bent electric wire and the inner circumference section is prevented and waterproofness can be improved.

DESCRIPTION OF REFERENCE NUMERALS AND SIGNS

1,1A WATERPROOF PLUG
2,2A RESIN MEMBER
20 THROUGH HOLE
21 FITTING SECTION
21a CONTACTING SECTION (OUTER CIRCUMFERENCE FACE OF RESIN MEMBER)
211 PROTRUDED CLAW SECTION
212 LONGITUDINAL GROOVE
22 FIXING SECTION
22a COMMUNICATION HOLE
3,3A SEALING SECTION
30 OUTER CIRCUMFERENCE SECTION
31 OUTER CIRCUMFERENCE LIP SECTION
33,33A INNER CIRCUMFERENCE SECTION
331 ELECTRIC WIRE INSERTION HOLE
332,332A INNER CIRCUMFERENCE LIP SECTION
4 CONNECTOR HOUSING
41 CAVITY
41a EDGE SECTION (ELECTRIC WIRE THROUGH HOLE OF CONNECTOR HOUSING)

The invention claimed is:

1. A waterproof plug, comprising:
a cylindrical resin member; and
a sealing section configured to include an outer circumference section which is provided on an outer face of the resin member and an inner circumference section which is provided on an inner face of the resin member,
wherein the outer circumference section of the sealing section intimately contacts to an inner wall face of a cavity of a connector housing, and the inner circumference section of the sealing section intimately contacts to an outer circumference face of an electric wire, the electric wire being pulled out of the cavity and being inserted into the inner circumference section;
wherein an outer circumference face of the resin member is brought into contact with an inner wall face of an electric wire through hole of the connector housing in which the electric wire is pulled out;
wherein the resin member is provided with a plurality of protruded claw sections protruding toward the inner circumference section side along a circumference direction of the resin member;
wherein the plurality of protruded claws sections are parts of the resin member;
wherein the inner circumference section of the sealing section is provided on the plurality of protruded claws sections; and
wherein the plurality of protruded claw sections receive the electric wire through the inner circumference section of the sealing section.

2. The waterproof plug according to claim 1, wherein the plurality of protruded claws are at least the three protruded claw sections formed at predetermined intervals.

\* \* \* \* \*